United States Patent [19]

Bowling et al.

[11] Patent Number: 4,853,650
[45] Date of Patent: Aug. 1, 1989

[54] SYMMETRIC WAVEGUIDE JUNCTION COMBINER

[75] Inventors: Donald R. Bowling; Charles F. Smith, both of Ridgecrest, Calif.

[73] Assignee: The United States of America as represented by The Secretary of the Navy, Washington, D.C.

[21] Appl. No.: 254,554

[22] Filed: Oct. 4, 1988

[51] Int. Cl.⁴ .................................... H03F 3/60
[52] U.S. Cl. ......................... 330/287; 330/56; 331/55; 331/107 DP; 333/21 A; 333/137
[58] Field of Search ............. 330/286, 287, 56; 331/107 DP, 107 P, 55, 56; 333/21 A, 125, 137, 227, 230, 248

[56] References Cited

U.S. PATENT DOCUMENTS

| | | | |
|---|---|---|---|
| 2,759,099 | 8/1956 | Olive | 331/55 |
| 3,931,587 | 1/1976 | Harp et al. | 331/56 |
| 4,074,265 | 2/1978 | True | 343/18 |
| 4,097,823 | 6/1978 | Jerinic et al. | 332/9 |
| 4,121,174 | 10/1978 | Aston | 331/48 |
| 4,147,994 | 4/1979 | Thoren et al. | 331/56 |
| 4,175,257 | 11/1979 | Smith et al. | 330/287 |
| 4,562,409 | 12/1985 | Saito et al. | 330/286 |

OTHER PUBLICATIONS

Montgomery, C. G., Dicke, R. H., Purcell, E. M.; *Principles of Microwave Circuits*, New York, 1948; pp. 466-479.

Genzton, Edward L.; *Microwave Measurements*: New York, 1957; pp. 296-297.

1983 *IEEE Microwave Theory and Techniques Symposium Digest*: pp. 166-168, Eisenhart, Dr. R. L.; Nevils, N. W.; Gulick, J. J.; Monzello, R. C.; "A Matched Turnstile Type 4-way Divider/Combiner".

*Primary Examiner*—James B. Mullins
*Attorney, Agent, or Firm*—Stephen J. Church; Melvin J. Sliwka; William C. Townsend

[57] ABSTRACT

A microwave power combiner having a spherical region from which six rectangular waveguides extend oppositely along mutually orthogonal diameters. The long dimension of each waveguide cross section extends along a diagonal of a cube circumscribing the region and extends orthognally to this long dimension of the opposite waveguide. One waveguide is an input for an injection locking signal, and four waveguides are inputs for power to be combined in the region from oscillators controlled by the signal. No circulator is required, and the combined power may be output through the remaining waveguide or through the injection locking input waveguide. A number of the combiners may be connected with the output of one combiner serving as an injection locking input or as one power input to another of the combiners.

20 Claims, 7 Drawing Sheets

SYMMETRIC WAVEGUIDE JUNCTION COMBINER

BACKGROUND OF THE INVENTION

1. Field of the Invention

This invention pertains to the fields of wave transmission lines, oscillators, and amplifiers. More particularly, the invention pertains to plural, parallel connected, transistor oscillators linked by a cavity.

2. Description of the Prior Art

In microwave power combiners it is desirable to combine, efficiently and usually over a wide bandwidth, microwave energy from several sources while providing effective isolation of the sources, the combiner output, and any injection locking oscillator. Although a variety of devices and systems have been developed for this purpose, deficiencies in prior art power combiners make it impossible to fully utilize the advantages of millimeter wave and higher frequencies and the advantages of solid state oscillators such as IMPATT diodes. At very high frequencies where resonant cavities are very small, combiners using resonant cavities can accommodate only a few oscillator inputs and effective cooling is difficult. All combiners are frequency dependent, but combiners involving resonance, having relatively poor isolation, and having configurations causing reflections are particularly deficient for operation over a wide bandwidth. Problems with poor isolation and reflections can be reduced by the addition of circulator devices and turning devices, but the bulk and weight of these devices is frequently a serious disadvantage while their frequency dependence reduces bandwidth and requires returning of connected and otherwise optimized devices.

Microwave power combiners of generally cubic symmetry having six orthogonally related, rectangular waveguide arms are well-known, and it is known in such combiners to provide isolation between one or more opposing arms by disposing their cross sections in orthogonal relation. However, such a combiner, which is simply an intersection of six arms with all opposing arms so disposed, or such a combiner, which has arm pairs in a configuration similar to a magic-T, obviously has many edges and reflecting surfaces at the arm junction region. Other prior art combiners of cubic symmetry have one opposing pair of arms disposed with orthogonally related cross sections and have the cross sections of the other four arms disposed in coplanar relation with a window arrangement at the arm junction to provide isolation. This arrangement also provides many edges and reflecting surfaces. Prior art waveguide junction combiners of cubic symmetry are, therefore, believed to be undersirably frequency dependent, to provide insufficient isolation, to require circulators when used with oscillators requiring injection locking, and to undesirably effect connected devices.

SUMMARY OF THE INVENTION

The present invention involves a waveguide junction power combiner of generally cubic symmetry with six rectangular waveguide ports extending from a spherical combining region in three pairs aligned with mutually orthogonal diameters of the region. In each pair, the ports extend oppositely of the region with their rectangular cross sections orthogonally related for isolation between opposing ports. The port sides are aligned with diagonals of a cube of symmetry of the junction to provide isolation between orthogonally related ports. For maximum symmetry, which gives equal power combination or division, the longer sides of each three ports adjacent to a pair of opposite corners of the cube are parallel to the three corresponding cube face diagonals intersecting at the corners.

Since the combiner is symmetrical, since the ports are well isolated, and since there are no planar surfaces and a minimal number of edges in the combining region, there are minimal reflections within and from the combining region to interfere with port isolation and create frequency dependent effects. As a result of the effective port isolation and minimum reflection, no circulator is required at any port of the combiner. Because frequency dependence effects are minimized, the combiner has a wide bandwidth and its inputs do not require tuning which might effect connected devices and reduce bandwidth.

The cubic configuration of the combiner and its elimination of circulators facilitates connection of a number of the combiners for greater power. When so connected, one port is an injection locking input, and the four ports orthogonal thereto are inputs directly from power oscillators which may be others of the combiners having their own power oscillators. The output from each combiner is provided at the injection input port when orthogonally related pairs of power input ports are in phase. However, if orthogonally related power input ports are 90 degrees out of phase, as by quarter wave plates at one such pair of power input ports, the output from the combiner is provided at the port opposite the injection input port. It is apparent that a system of such combiners has the ultimate power oscillators spaced apart and distributed about the system. As a result even at relatively high frequencies where waveguides, resonant cavities, coaxial connections and the like are very small, there is room for ports, oscillator diode connections, and effective heatsinking.

It is a object of the present invention to provide a microwave power combiner particularly effective with a number of sources, high power, and millimeter wave and higher frequencies.

Another object is to provide such a power combiner of high efficiency and wide bandwidth.

A particular object is to provide a power combiner having the above advantages and serving as its own circulator.

Still another object is to provide such a power combiner in which injection locking of a number of microwave sources and combining of the resulting power is conveniently and simply achieved.

Yet another object is to provide a power combiner easily connected in multiples to provide high power.

A further object is to provide combiner which, when so connected, may be easily and effectively cooled.

BRIEF DESCRIPTION OF THE DRAWINGS

Other objects, advantages, and novel features of the present invention will become apparent from the following detailed description when considered with the accompanying drawings in which.

DETAILED DESCRIPTION

Figure 1:
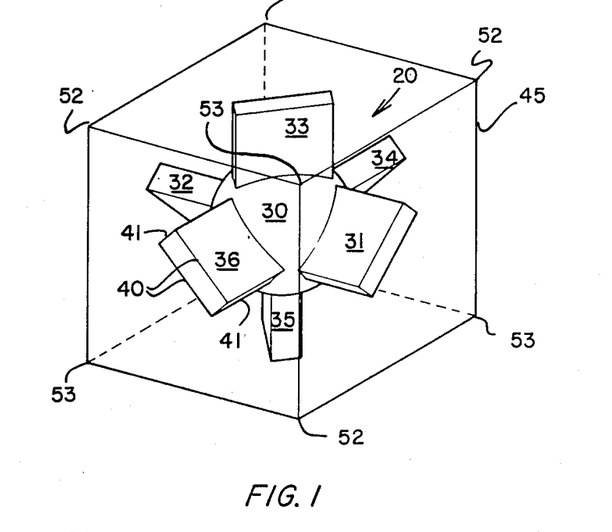
FIG. 1 is a schematic view showing a spherical combining region and six waveguide ports with cubic symmetry of a power combiner element of the present invention.
Figure 2:
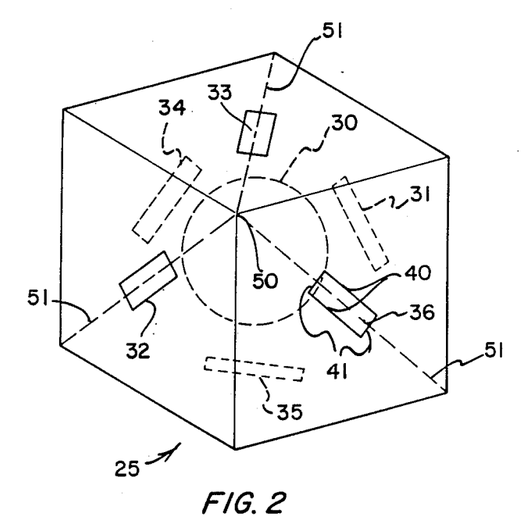
FIG. 2 is an isometric exterior view of a cube forming the element of FIG. 1.
Figure 3:
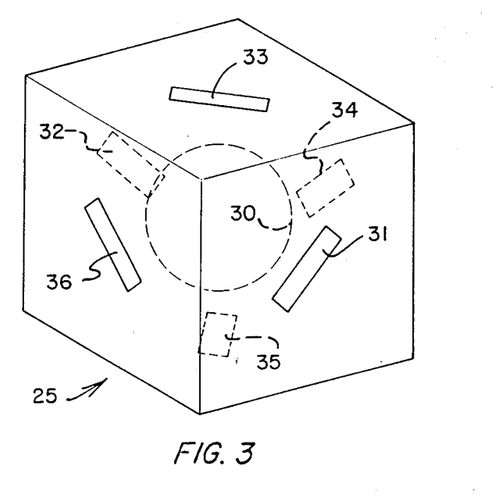
FIG. 3 is a view similar to FIG. 2 with the cube rotated 90 degrees from its position therein.

FIG. 1 depicts schematically a device 20, which embodies the present invention, for combining microwave energy from a plurality of sources, a device for this purpose being commonly referred to as a "power combiner". A power combiner of the present invention is conveniently, but not necessarily, embodied in a metal body or cube 25, as depicted in FIGS. 2 and 3, defining hollow regions of novel configuration and shortly to be described. Such regions of the present invention may, of course, be defined by other constructions providing a microwave reflecting interior surface for the regions.

Device 20 and cube 25 each have a hollow, spherical combining region or spherical cavity 30 and have six hollow waveguide regions 31 through 36 extending radially from the spherical region. Regions 31-36 are sometimes referred to in the present application as "port cavities" or simply as "waveguides". Insofar as device 20 and cube 25 themselves are concerned, waveguide regions 31-36 are interchangeable because of a specific cubical symmetry of the wave guide regions about the spherical region, this symmetry being subsequently described in detail. However, a system, which embodies the present invention by having an element corresponding to such a device or cube, may have a particular waveguide region thereof allocated for connection to a particular other element of the system.

Regions 31-36 all have a substantially identical rectangular waveguide cross section with, as indicated for region 36 in FIGS. 1 and 2, a pair of longer sides or opposite wider planar surfaces 40 and a pair of shorter sides or opposite narrower planar surfaces 41. The rectangular cross section has any proportions and dimensions suitable for frequencies of microwave energy to be combined by device 20 or cube 25. Sides 40 and 41 are parallel to diagonals of the faces of cube 25, FIGS. 2 and 3. In these two figures, regions 31-36 are represented by the openings thereof through the cube faces, and region 30 is represented by a dash line circle, the portions of regions 31-36 between the faces and the circle being omitted for clarity. In FIG. 1, sides 40 and 41 are parallel to corresponding diagonals, not shown but apparent from a schematic cube of symmetry 45 which is represented as transparent in order to show the intersecting three dimensional form of regions 30-36.

The following relations of regions 30-31, sides 40 and 41, and cubes 25 and 45 will be apparent from FIGS. 1-3. First, waveguide regions 31-36 are of rectangular parallelepiped configuration and are disposed in three pairs, namely, regions 31 and 32, regions 33 and 35, and regions 34 and 36. The waveguide regions of each pair thereof extend oppositely from the center of spherical combining region 30 with the pairs extending individually along mutually orthogonal diameters of the region and the waveguide region sides or surfaces 40 and 41 parallel to the corresponding such a diameter. Spherical region 30 is circumscribed by cube 45 and by the faces of cube 25, so that regions 31-36 extend individually and perpendicularly inwardly from the cube faces. The length of a diameter of the combining region is somewhat greater than the length of a diagonal of the cross section of the waveguide regions so that each waveguide region opens into and communicates with the combining region. Each waveguide region 31-36 thus has one end which is smaller than region 30 and opens thereinto and has an opposite end, which is of the same size and which opens through the one of such cube faces which corresponds to the waveguide region. The exact dimensional relation of region 30 diameter to the diagonal of a waveguide region 31-36 cross section is believed not critical in operation of a device 20 or cube 25 of the present invention. However, increasing the diameter relative to the diagonal is believed to provide somewhat greater bandwidth at the cost of somewhat reduced isolation between waveguide regions.

Second, in each of the waveguide region pairs formed by regions 31 and 32, regions 33 and 35, and regions 34 and 36, the two regions of each pair are spaced apart by spherical region 30 and are aligned in opposing relation oppositely thereof with the cross sections of the two opposing, aligned waveguides in orthogonal relation. That is, the longer surfaces or sides, such as sides 40, of one waveguide region of such a pair extend at a right angle to the longer sides of the other waveguide region of the pair. This orthogonal relation may also be defined by stating that, in each pair of such opposing waveguide regions, the two regions are rotationally disposed about the corresponding diameter of region 30 so that the corresponding waveguide region sides, longer sides 40 or shorter sides 41, of one region are orthogonal to the corresponding sides of the opposing region. As a result of this orthogonal relation, a substantial amount of microwave energy is not transmitted between such opposing waveguide regions Third, regions 31-36 have a specific common cubic symmetry best shown in FIG. 2 on cube 25 where three faces of the cube, which are adjacent to a corner 50 thereof and which correspond individually to adjacent waveguide regions 32, 33, and 36, have indicated on the three faces individual diagonals 51 thereof intersecting at corner 50. This symmetry is provided by these three regions having their longer sides, as typified by sides 40 of region 36, each parallel to the corresponding one of the face diagonals 51. This symmetry may also be defined by stating that an adjacent three of the regions 31-36 are disposed so that the longer sides, such as sides 40, of the three adjacent regions substantially intersect at common point, typified by corner 50 of cube 25. It is apparent that, if cube 25 is rotated 90 degrees from its position shown in FIG. 2 about an axis normal to the cube faces corresponding to waveguide regions 33 and 35, cube 25 and waveguide regions 31–36 will be in their position shown in FIG. 3, this FIG. 3 cube position corresponding to that shown in FIG. 1. Since it is required that opposing waveguide regions have their cross sections orthogonally related and it is required that three adjacent waveguide regions have their longer sides parallel to corresponding cube face diagonals intersecting at a cube corner, each cube face necessarily has, as shown in FIG. 1, a pair of opposite corners 52 at which such cube face diagonals intersecting thereat are parallel to such longer sides of three adjacent waveguide regions. Also, the other pair of opposite corners 53 of each such code face necessarily have such cube face diagonals intersecting thereat parallel to the shorter sides, such as sides 41, of regions 31–36.

As a result of the specific cubical symmetry described in the previous paragraph for the waveguide regions 31–36, which have their sides, such as sides 40 and 41, parallel to diagonals, such as 51, of cubes 25 or 45, microwave energy, as from an injection locking oscillator entering a waveguide region corresponding to region 31, substantially enters only the regions 33–36 orthogonal thereto from spherical region 30. Also as a result of this symmetry, microwave entering region 30 from regions 33–36, as from four substantially balanced power oscillators controlled by the injection locking oscillator, substantially enters only either region 31 or the opposed region 32 depending on the phase relations of such power oscillator energy as it enters region 30, arrangements for determining such phase relations to select the whether the power oscillator energy enters region 31 or region 32 being subsequently described.

Figure 4:
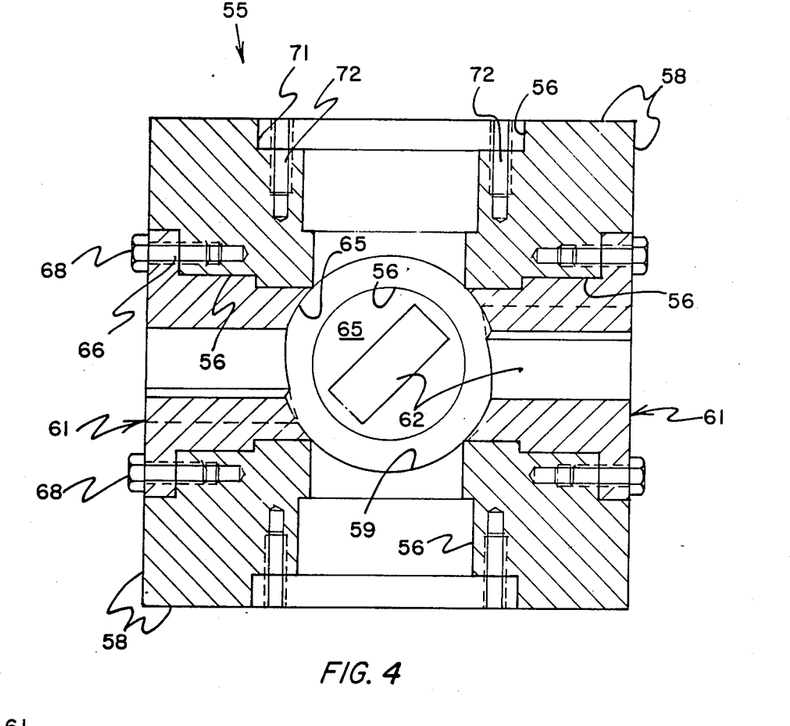
FIG. 4 is a section of a cubic power combiner element similar to that of FIG. 1, but having plugs defining the ports for selective, rotational positioning thereof.
Figure 5:
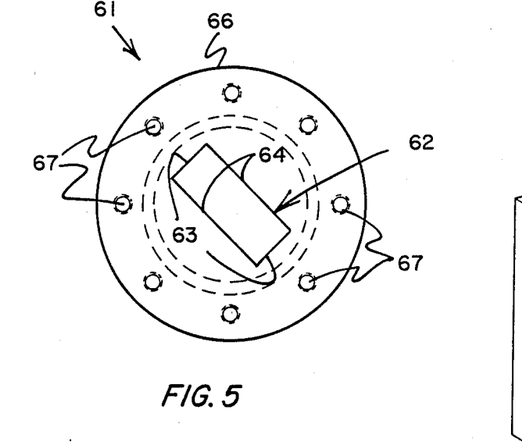
FIG. 5 is an end view of one of the plugs of FIG. 4.

FIG. 4 shows a cube 55 having six generally cylindrical openings 56 extending individually and perpendicularly from each face 58 thereof to a spherical cavity 59 at the cube center. Opposed pairs of openings 56 thus have as their axes mutually orthogonal diameters of cavity 59. Cube 55 has six generally cylindrical plugs 61 conforming to and individually receivable in openings 56 for rotation about the corresponding such diameters. Only three of the plugs 61 are shown in FIG. 4, the upper and lower such plugs therein being omitted to better show the corresponding two of the openings 56. As shown in FIGS. 4 and 5, each plug 61 has a rectangular waveguide cavity 62 extending axially through the plug. Cavity 62 corresponds to one of the waveguide regions 31–36 and has narrower side surfaces 63 and wider side surfaces 64. Each plug 61 has an inner end 65, which is spherically concave to conform to cavity 59, and has an outer end which is circumscribed by a flange 66 having eight bores 67 extended through it axially of the plug. Bores 67 are equally spaced circumferentially about flange 66 with a diametrically opposite pair of the bores aligned with narrower surfaces 63. Each bore 67 receives a screw 68. At the outer end of each opening 56, a cube 55 has a counterbore 71 to receive a flange 66 and has a eight screw threaded bores 72 to receive the corresponding screws 68. It is apparent that a plug 61 can be placed in an opening 56 and selectively rotated to any one of the eight positions where bores 67 and 72 align to place a waveguide cavity side 63 or 64 parallel to any predetermined side or diagonal of the corresponding cube face. Screws 68 are then inserted through bores 67 and screwthreadably engaged with bores 72 to secure the plug 61 in a selected one of the positions.

Figure 6:
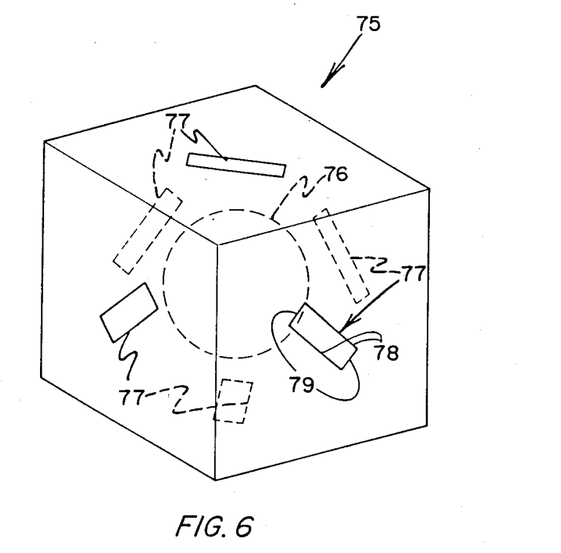
FIG. 6 is an exterior view of a cubic power combiner element similar to those of FIGS. 1-3, but having ports of a somewhat different and less effective orientation.

FIG. 6 shows a cube 75 which is similar to microwave power combiner cube 25 in having a central spherical region 76 and six rectangular wave guide regions 77 radiating therefrom to each face of the cube and in that each region 77 has wider sides 78 and narrower sides 79 with the wider sides of opposing regions 77 orthogonally related. However, waveguide regions 77 do not have the desirable symmetry of regions 31–36 of cube 25 because, as may be seen by inspection of FIG. 6, regions 77 of cube 22 have an orientation such that there are no three of the regions 77 adjacent to a corner of cube 75 and having their longer sides 78 parallel to cube face diagonals which correspond to the three regions 77 and which intersect at the cube corner. As a result, although a power combiner constructed similarly to cube 75 and having its orientation of waveguide regions 77 may be effective in some power combiner applications because there is substantial isolation between any opposed pair of the regions and between any opposed pair of the regions and the four waveguide regions orthogonal to the opposed pair, a power combiner with this cube 75 orientation may have, for other applications, insufficient isolation between these four regions themselves.

Figure 7:
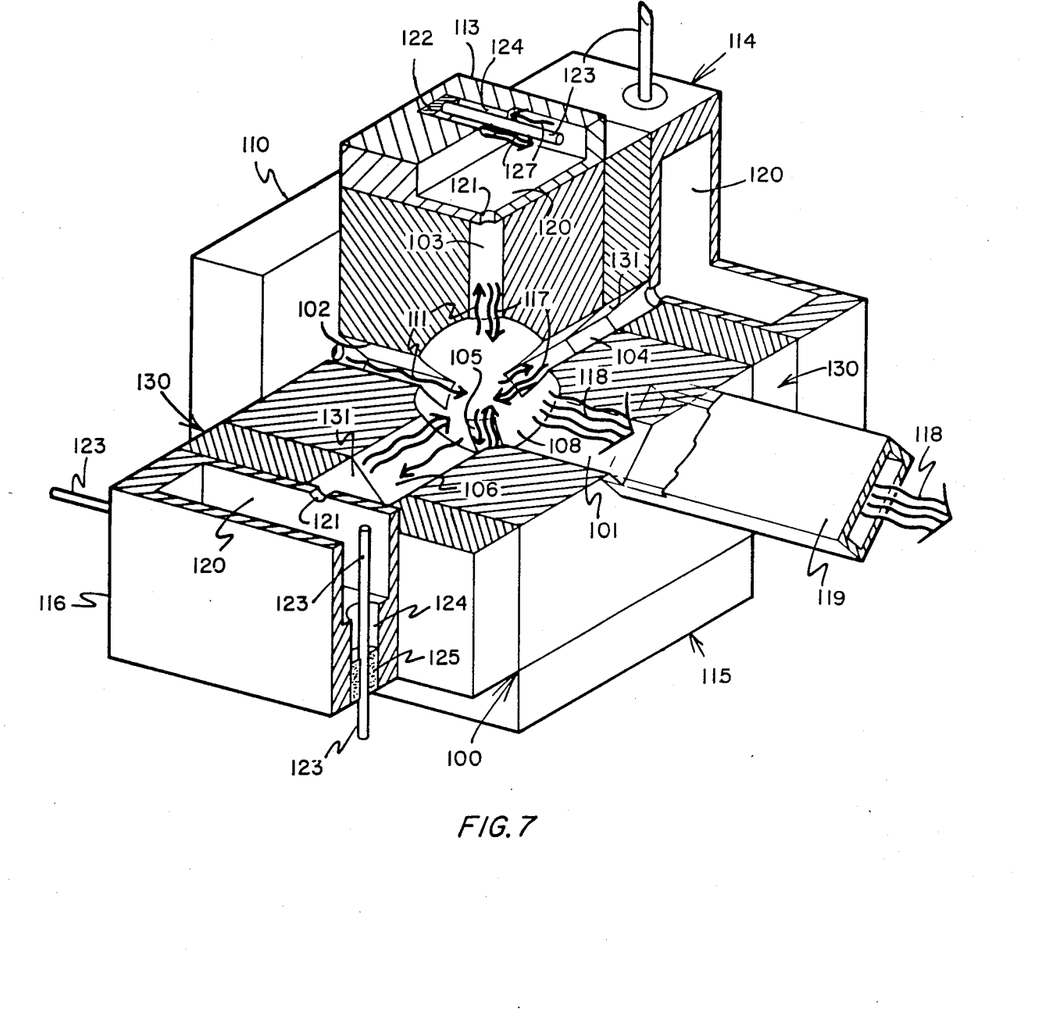
FIG. 7 is a isometric view of a power combiner system, partially sectioned along several planes, having a cube similar to that of FIG. 2 used in a transmission mode with solid state oscillators and other associated elements.

FIG. 7 shows a microwave amplifier system using a body or cube 100 which has an output or opposing waveguide 101, an injection locking waveguide 102, and four power wave guides 103–106 all radiating from a spherical combining region 108. Waveguides 101–106 correspond, respectively, to waveguide regions 31–36 of cube 25 shown in FIGS. 2 and 3 and have the same configuration, spatial relations, and symmetry. Waveguides 103 and 105 are thus a first pair of power waveguides extending orthogonally to a second pair of power waveguides 104 and 106, each such pair extending orthogonally to oppositely from injection waveguide 101 and output waveguide 102.

The system of FIG. 7 has any suitable injection locking oscillator 110 which is represented as a block mounted on cube 100 so as to provide injection locking microwave energy, represented by single sinuous line arrows 111, to waveguide 102 for distribution via region 108 to waveguides 103–106. The system has four balanced and substantially identical power oscillators 113–106 mounted on cube 100 individually at waveguides 103–106 so that the system has a first pair of power oscillators corresponding to waveguides 103 and 105 and has a second pair of power oscillators corresponding to waveguides 104 and 106. Each power oscillator 113–116 is adapted to receive the injection locking energy 111 entering the corresponding waveguide and to generate amplified microwave energy which is represented by double sinuous line arrows 117 and corresponds in frequency and phase to energy 111. Amplified energy 117 from each oscillator 113–116 typically and depending on the nature of the oscillator, includes a substantial amount of the injection energy 111 provided to the oscillator in addition to the microwave energy which can be generated by the oscillator alone. Each oscillator 113–116 delivers its amplified energy 117 to the corresponding waveguide 103–106 for delivery therethrough to region 108 where the amplified energy is combined. Substantially all of the combined amplified energy exits region 108 at output waveguide 101 as indicated by quadruple sinuous line arrows 118 for delivery, as by a waveguide 119 which is a continuation of wave guide 101, for any desired use. Since injection locking energy 111 enters cube 100 at waveguide 102 and the amplified and combined energy from oscillators exits the cube at the opposing waveguide 101, cube 100 operates in what may be termed the "transmission mode."

Although many kinds of microwave oscillators corresponding to power oscillators 113–116 may be used in the practice of the subject invention, oscillators 113–116 are depicted as having a representative construction advantageous with the present invention. Oscillators 113–116 are of a construction which is well-known and therefore schematically represented. In this construction, each power oscillator has a body defining a Kurakawa cavity 120, visible in oscillators 113, 114, and 116 which are depicted as partially sectioned. Cavity 120 outputs microwave energy 117 through an iris 121 which also admits injection locking energy 111. Each power oscillator derives its amplified microwave energy from a well-known IMPATT diode 122, as shown for oscillator 113. Diode 122 thus serves as a primary oscillator for oscillator 113 and is energized by a bias lead 123 which passes through suitable bores 124 in the body and exits therefrom, as shown for oscillator 116, through a glossy insulating element 125. It is apparent that the FIG. 7 system has a plurality of the IMPATT diodes 122, one for each oscillator 113–116 as can be seen from the bias leads 123 extended externally from oscillator 114–116. As indicated at oscillator 113 by arrows 127, each diode 122 receives injection locking energy from the corresponding cavity 120 and outputs energy amplified energy thereto through the coaxial circuit formed by bias lead 123 and the bore 124 adjacent to the diode. Oscillators 113–116 typically have different angular orientations about cube 100 to avoid physical interference between the leads 123. Many other details and specific proportions of oscillators 113–116 are not represented in the drawings since suitable such arrangements will be apparent to one skilled in the art of solid state microwave oscillators.

The microwave amplifier system of FIG. 7 is characterized by having a pair of quarter wave plates 130, one plate 130 being disposed between oscillator 114 and the face of cube 100 through which waveguide 104 opens and the other plate 130 being disposed between oscillator 116 and the cube face corresponding to waveguide 106. Each plate 130 defines a waveguide section 131 which is a continuation of the corresponding waveguide 104 or 106 to the associated iris 121. Wave guides 103 and 105 are not provided with a quarter wave plate so that, in effect, waveguides 104 and 106 are longer than waveguides 103 and 105 by a distance equal to the length of one section 131. This distance is selected, in a manner well-known to one skilled in the waveguide art, to introduce about a one-quarter cycle delay in the one-direction propagation of microwave energy, which is at the frequency of injection locking energy 111 and amplified energy 117, along waveguides 104 and 106 between the corresponding amplifier 114 and 116 and region 108 relative to the propagation of such energy along waveguides 103 and 105. Since a quarter cycle delay occurs as the injection locking energy is propagated from region 108 to amplifiers 104 and 106 and there is another one-quarter cycle delay as the amplified energy propagates therefrom back to region 108, there is, due to waveplates 130, a total delay resulting in about one-half cycle phase difference between amplified energy entering region 108 from amplifiers 103 and 105 and such energy entering this region from amplifier 103 and 105. It has been found that, as a result of this one-half cycle difference and the previously described configuration of waveguides 101–106 and region 108, substantially all of the injection locking energy 111 is apportioned equally to waveguides 103–106 and substantially all of the amplified microwave energy 117 combined region 108 exits therefrom by waveguide 102 while devices such as amplifiers 102 and 113–116 and any device on waveguide 119 are substantially isolated from each other although the FIG. 7 system does not include a circulator.

It can be seen from FIG. 7 that the block-like construction of cube 100 and plates 130 provides effective heat sinking and conduction for a power combiner of the present invention. Also, this construction may conveniently incorporate any suitable liquid coolant passages, not shown, intertwined with waveguides 101–106. The branching disposition of power oscillators 113–116 in spaced relation about cube 100 allows convenient connection of electrical and cooling connections to the power oscillators. As will be subsequently apparent, the branching configuration and block-like construction also make possible cascaded power combiner arrangements, which are compact and yet convenient for cooling and connection because of the distributed power oscillators, using the principles of the present invention to combine microwave energy from many solid state or other primary sources to provide levels of microwave power suitable for high powered radar applications.

Figure 8:
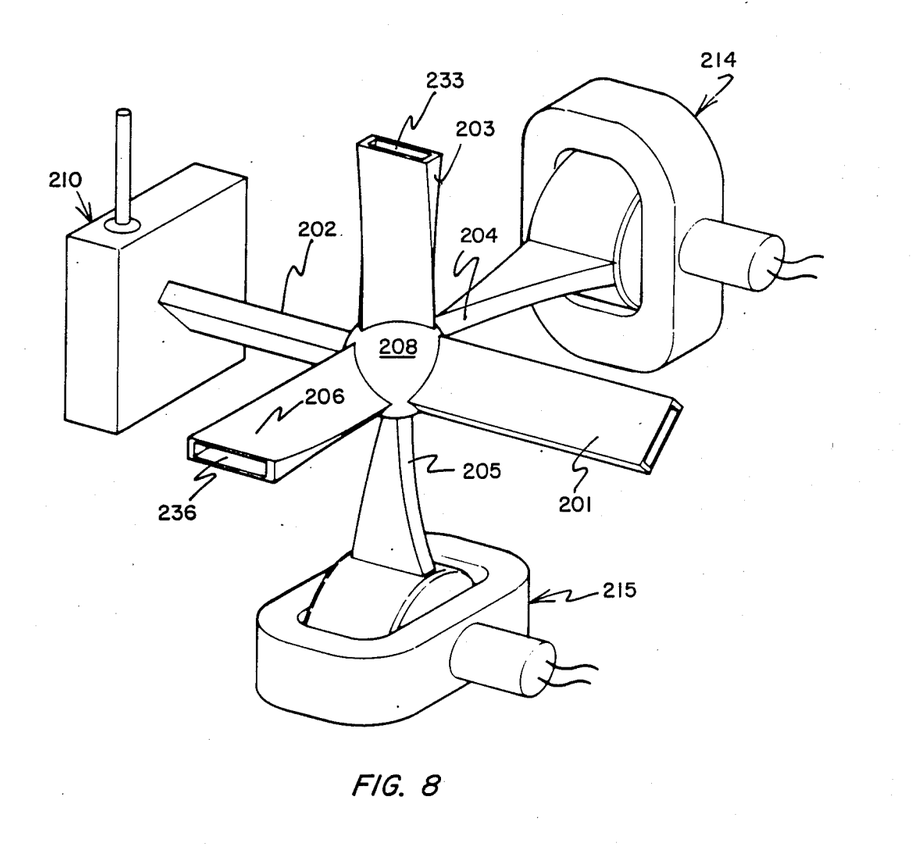
FIG. 8 is a view of a system similar to that of FIG. 7, but having a power combiner element of cubic symmetry and magnetron oscillators.

FIG. 8 shows a microwave amplifier system using the principles of the present invention similarly to the system of FIG. 7, but with different kinds of elements, the elements of FIG. 8 being schematically represented since suitable details and proportions are well-known in the art of microwave systems. The system of FIG. 8 would, typically, be used with microwave energy of lower frequency and greater power than microwave energy in the FIG. 7 system; however, these systems are sufficiently similar that most of the FIG. 8 elements may be identified by numerals having a value one hundred more than the numerals of corresponding FIG. 7 elements. The FIG. 8 system thus has an output waveguide 201, an injection locking waveguide 202, four power wave guides 203–206, and a spherical combining region 208. Waveguides 201–206 may be constructed of rectangular metal tubing and fixedly connected to a spherical metal shell forming region 108 so that this region and connected waveguides 201–206 form a power combiner element having, functionally, the same cubic symmetry as device 20 or cube 25. The FIG. 8 system has an oscillator 210, which is schematically represented as a solid state device similar to the oscillators in FIG. 7, for providing injection locking microwave energy to waveguide 202. The FIG. 8 system is provided with amplified microwave energy by four substantially identical magnetrons which are individually connected to waveguides 203–206 oppositely of region 208; however, for illustrative convenience FIG. 8 depicts only two such magnetrons, which are identified by numerals 214 and 215 and connect, respectively, to waveguides 204 and 205. The other two magnetrons are connected to waveguides 203 and 206 at ends thereof identified, respectively, by numerals 233 and 236. Waveguides 203–206 are twisted merely so that the associated magnetrons may be axially parallel for convenience in mounting or connection. It will be noted that waveguides 204 and 206 are significantly longer than waveguides 203 and 205. The additional length of wave guides 204 and 206 corresponds to the additional length introduced into waveguides 104 and 106 by plates 130, and provides for a one-half cycle phase difference between amplified microwave energy entering region 208 from the magnetrons associated with waveguides 203 and 205 and such energy entering region 208 from the magnetrons associated with waveguides 204 and 206. As a result, such magnetrons are controlled in frequency and phase by oscillator 210, and the combined microwave energy from the magnetrons is provided via output waveguide 201, mutual isolation being provided between the oscillator, the magnetrons, and the output waveguide without the use of a circulator.

Figure 9:
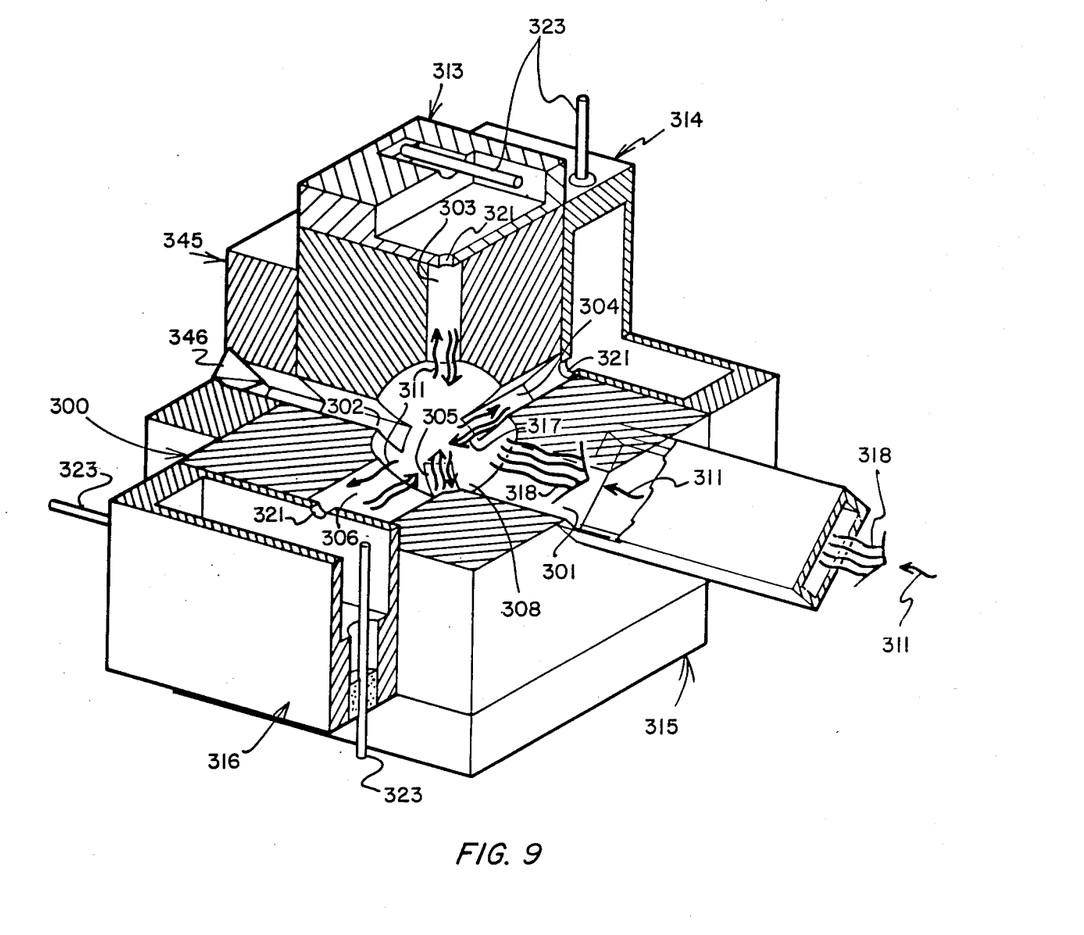
FIG. 9 is a view similar to FIG. 7 of a power combiner system having the cube used in a reflection mode.

FIG. 9 shows another microwave amplifier system embodying the principles of the present invention and using many elements which are substantially identical to those of the FIG. 7 system, the FIG. 9 elements corresponding to elements of FIG. 7 being identified by numerals having a value two hundred higher than the corresponding FIG. 7 elements. The FIG. 9 system thus has a cube 300, which is substantially identical to cube 200, and defines waveguides 301-306 radiating to the cube faces from a spherical region 308. Waveguides 303-306 function similarly to waveguides 103-106 and are associated, respectively, with solid state microwave oscillators 313-316 which receive injection locking energy 311 from the corresponding waveguide and provide thereto amplified energy 318 which is combined in region 308 and exits therefrom via waveguide 301. Oscillators 313-316, which are substantially identical to each other and to oscillators 113-116, each have an iris 321 as shown for oscillators 313, 314, and 316 and have a bias lead 323. In contrast to the FIG. 7 system, in which injection locking energy 111 is provided by a separate oscillator 110, energy 311 is provided to waveguide 301 oppositely of region 308. Wave guide 301 thus serves as both an input and output waveguide so that cube 300 functions in what may be termed the "reflection mode." How locking energy and amplified energy may utilize such a single waveguide will be apparent from a subsequently described microwave amplifier system. Also in contrast to the FIG. 7 system, the waveguide 302 opposed to output waveguide 301 has no function exteriorly of cube 300. If oscillators 313-316 were perfectly balanced, the end of waveguide 302 opposite region 308 might be left open; however, this end is preferably blanked to suppress any reflected microwave energy thereat with any suitable terminator 345, typically having a short waveguide section mating with waveguide 302 and enclosing a pyramid 346 of lossy material.

The amplifier system of FIG. 9 is distinguished from that of FIG. 7 and is characterized by having waveguides 303-316 of substantially equal length between each iris 321 and spherical region 308. As a result, amplified energy 317 from the four oscillators 313-316 corresponding to waveguides 303-306 enters region 308 substantially in phase. It has been found that, as a result of this in phase relationship and of the configuration of waveguides 301-306 and region 308, substantially all of the amplified microwave energy 317 entering region 308 is combined therein and exits this region through the same waveguide 301 through which injection locking energy 311 entered the region.

Figure 10:
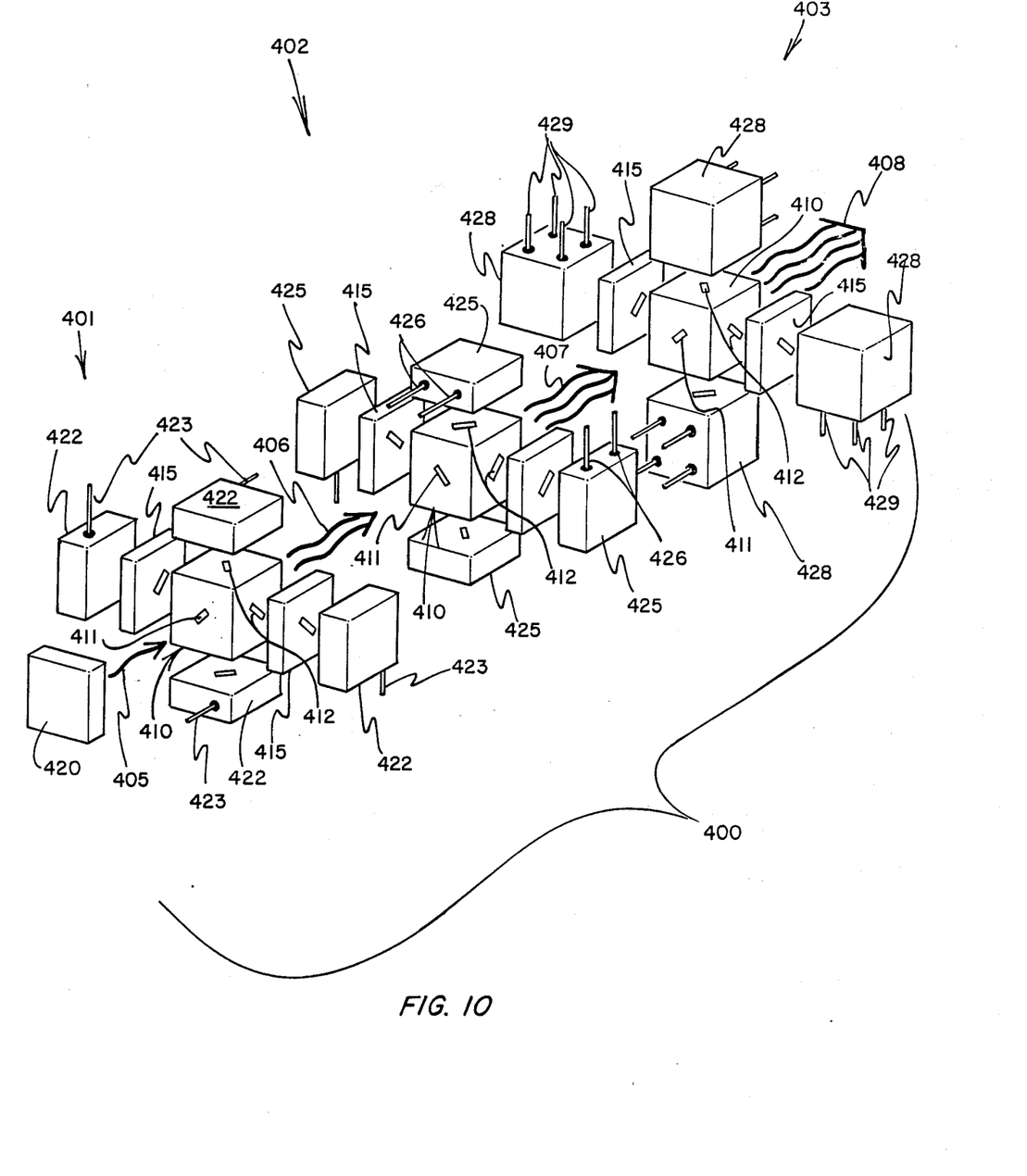
FIG. 10 is a schematic, exploded view of a system similar to that of FIG. 7, but cascaded with additional such cubes and elements.

FIG. 10 shows a microwave power amplifier or combiner system 400 having a first power combiner 401 with active amplifiers, a second such power combiner 402, and a third such power combiner 403. These combiners are connected in cascaded relation with combiner 401 receiving initial injection locking energy, which is indicated by arrow 405, and providing amplified energy, which is indicated by arrow 406 and corresponds to energy 111, as injection locking energy to combiner 402. Combiner 402, in turn, provides further amplified microwave energy, which corresponds to energy 118 and is indicated by arrow 407, as injection locking energy to combiner 403. Combiner 403 outputs even further amplified energy indicated by arrow 408 and controlled in phase and frequency by initial locking energy 405. As mentioned above, a substantial amount of the injection locking energy provided to each combiner appears at the output thereof so that energy 408 output by system 400 includes microwave energy actively generated in all three combiners 401-403.

Before describing further details of system 400, it should be noted that in FIG. 10, as in subsequently described FIG. 11, the elements are not sectioned or depicted as transparent so that, because of the direction from which the elements are viewed, various features thereof are not visible. The elements will, however, be described as if the features were visible. For example, a cube may be described as having four waveguides corresponding to waveguides 103-106 of FIG. 7 even though only one or two of the four waveguides is depicted.

Each combiner 401-403 is similar to the system depicted in FIG. 7 and has a cube 410 which is substantially identical to cube 100. Each cube 410 thus has an input waveguide 411 corresponding to waveguide 102 and has four power oscillator waveguides 412 orthogonal to waveguide 411 and corresponding to waveguides 103-106. Each cube 410 has a spherical combining region, which corresponds to region 108, and has an output waveguide, which corresponds to waveguide 101 and from which energy 406, 407, or 408 issues, this region and wave guide not being visible in FIG. 10. Each combiner 401-403 has a pair of quarter-wave plates 415 corresponding to plates 130 and individually disposed at one opposing pair of the waveguides 412.

Combiner 401 has an injection locking oscillator 420 corresponding to oscillator 110 to provide energy 405 and has four power oscillator 422 which are substantially identical structurally and functionally to oscillators 113-114 and are thus individual to the waveguides 412 of combiner 401. Each oscillator 422 has a single IMPATT diode or primary oscillator as indicated by a single bias lead 423 extended from each oscillator 422. Combiner 402 has four power oscillators 425 which are similar to oscillators 113-116 and are thus individual to waveguides 412 of combiner 402. However, oscillators 425 each have two IMPATT diodes as indicated by two bias leads 426 extending from each oscillator 425. Combiner 402 has four power oscillators 428 which are similar to oscillators 113-116 and are individual to waveguides 412 of combiner 403. However, each oscillator 428 has four IMPATT diodes as indicated by four bias leads 429 extending from each of the oscillators 425. The power oscillators 425 of combiner 402 thus collectively have a larger number of IMPATT diodes and output substantially more mircowave energy than do all of the power oscillators 422 of combiner 401. Similarly, the power oscillators of combiner 403 together have, in turn, a larger number of IMPATT diodes and output more microwave energy than do all of the oscillators 425. As a result, injection locking energy 405, although sufficient to control the amplified mirowave energy provided by the four IMPATT diodes of combiner 401, may be insufficient to control the amplified energy provided by the eight IMPATT diodes of the oscillators 425 of combiner 402. However, the amplified energy 406 received by combiner 402 from combiner 401 is sufficient for injection locking of the oscillators 425. Similarly, energy 407 is sufficient for injection locking of the sixteen IMPATT diodes of combiner 403.

Figure 11:
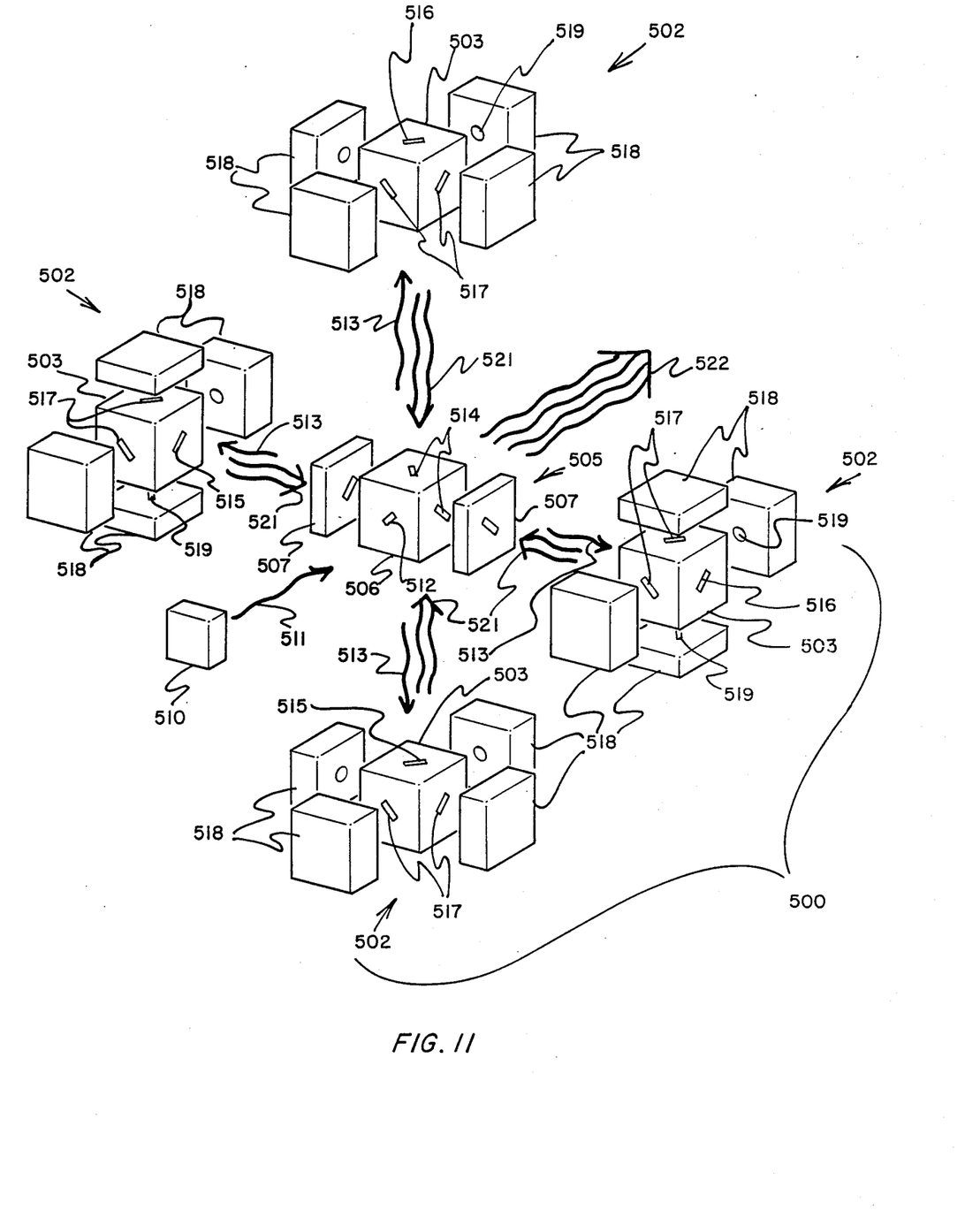
FIG. 11 is a view similar to FIG. 10 of a power combiner system using one such cube in the transmission mode with four other of the cubes in the reflection mode.

FIG. 11 shows a microwave power amplifier or combiner system 500 having four substantially identical power combiners 502. Each combiner 500 has active amplifiers and has a power combiner cube 503 substantially identical to cube 300 of the FIG. 9 system and, similarly, operating in the reflection mode. System 500 also has one power combiner 505 which is disposed centrally of combiners 502 and does not itself have any active elements. Combiner 505 includes a cube 506, which is substantially identical to cube 100 of the FIG. 7 system, and includes a pair of quarter wave plates 507, which are disposed oppositely of cube 506 and correspond to plates 130 of the FIG. 7 system, so that cube 506 likewise operates in the transmission mode.

System 500 has an injection locking oscillator 510 which provides injection locking microwave energy 511 to an injection locking waveguide 512 of cube 505, this energy being distributed therefrom to reflection combiners 502, as indicated by arrows 513, via four cube 505 power wave guides 514 orthogonal to waveguide 512, the distributed injection locking energy entering an input/output waveguide 515 of each cube 503. Appropriately to the transmission mode of cube 505, the locking energy to the two of the cubes 503 juxtapositioned to plates 507 is delayed one-fourth cycle thereby in relation to this energy to the other two of the cubes 503. Opposite waveguide 515, each cube 503 has a blanked waveguide 516 which has any suitable termination, not shown, corresponding to terminator 345. In each combiner 502, the cube 503 then distributes the locking energy via four power waveguides 517 thereof, which are orthogonal to waveguides 515 and 516, to four power oscillators 518 which may be of any suitable type and, accordingly, are represented as blocks each having an iris 519. Amplified microwave energy generated in each oscillator 518 and controlled in phase and frequency by locking energy 511 enters, via waveguides 517, in phase into each cube 503 and, in accordance with the reflection mode thereof, exits therefrom, as combined amplified energy indicated by arrows 521, via waveguide 515 to waveguides 514 of cube 505. This energy 521 from the two of the cubes 503 connected to cube 505 by plates 507 is delayed, and as discussed above in connection with the system of FIG. 7, enters cube 505 about one-half cycle out of phase with such combined energy from the other two cubes 503. As a result, the combined amplified energy 521 provided by reflection combiners 502 is combined in transmission combiner 505 and provided therefrom by system 500, as indicated by arrows 522, via the cube 505 output waveguide, not visible, opposing waveguide 512.

Obviously many modifications and variations of the present invention are possible in light of the above teachings. It is, therefore, to be understood that the invention may be practised within the scope of the following claims other than as specifically described.

What is claimed is:

1. A microwave power combiner comprising a body defining;

a hollow, generally spherical combining region, and a plurality of hollow waveguide regions extending radially from the combining region in mutually orthogonal directions, each waveguide region having a generally rectangular cross section with a pair of shorter sides and a pair of longer sides, the longer sides of each pair of waveguide regions which are diametrically opposite the combining region being orthogonally related.

2. The combiner of claim 1 wherein said sides of the wave guide regions are parallel to diagonals of faces of a cube circumscribing the combining region.

3. The combiner of claim 2 wherein the combiner has three adjacent such waveguide regions corresponding individually to three such faces adjacent to a corner of such a cube, and wherein such longer sides of said three adjacent waveguide regions are individually parallel to three such diagonals which are individual to said three faces and which intersect at said corner.

4. A microwave power combiner comprising:

a plurality of pairs of waveguides of rectangular cross section, each pair extending oppositely from a predetermined point and said pairs extending mutually orthogonally therefrom;

a spherical combining region centered at said point and having a diameter greater than the length of any diagonal of such a cross section so that each waveguide of said plurality of pairs thereof opens into said region.

5. The combiner of claim 4 wherein said cross section has a longer dimension and a shorter dimension and wherein, in each of said pairs, the longer dimensions of the waveguides thereof are orthogonally related.

6. A microwave amplifier system comprising:

an injection locking waveguide, an opposing waveguide aligned therewith and spaced therefrom, and a pair of aligned, spaced power waveguides extending oppositely from between the injection locking waveguide and said opposing waveguide in orthogonal relation thereto, each of said waveguides having a rectangular cross section with a pair of shorter sides and a pair of longer sides, said longer sides of each one of the waveguides being orthogonal to such longer sides of such waveguide aligned with said one waveguide;

means connected to the injection locking waveguide for providing injection locking microwave energy thereto;

power oscillator means connected to each of said power waveguides for providing thereto amplified microwave energy corresponding to said injection locking energy when said oscillator means are provided therewith through the corresponding power waveguides; and a body defining a combining region between and intersecting said injection locking waveguide, said opposing waveguide, and said power waveguides, said region having a common symmetric configuration in relation to all of said waveguides, so that, because of the orthogonal relation of such longer sides, substantial microwave energy is not transmitted between such aligned waveguides and, because of said configuration, a portion of said injection locking energy entering said region from the injection locking waveguide enters the power waveguides and said amplified microwave energy entering said region from the power waveguides enters the injection locking waveguide or said opposing waveguide.

7. The system of claim 6 wherein the combining region is spherical and hollow and has a diameter larger than a diagonal of each such waveguide cross section, said region communicating with all of said waveguides and being disposed centrally thereof.

8. The system of claim 6 wherein said pair of power waveguides is one pair of two pairs thereof extending in orthogonal relation.

9. The system of claim 8 wherein such longer sides of an adjacent three of the injection locking waveguide, the opposing waveguide, and the power waveguides are disposed so that extensions of said longer sides of each such adjacent three waveguides substantially intersect at a common point.

10. The system of claim 8 wherein said power waveguides of each of said two pairs thereof are configured so that such amplified energy from each of said power oscillators corresponding to said power waveguides enters said region substantially in phase and so that substantially all of said amplified energy entering said region exits therefrom at said injection locking waveguide.

11. The system of claim 10 further comprising termination means connected to said opposing waveguide for suppressing any reflected microwave energy thereat.

12. The system of claim 10:
wherein a first pair and a second pair of such power waveguides are configured so that such amplified energy enters a corresponding such combining region substantially in phase, such a first pair and second pair of power oscillator means, such a body defining such a combining region which corresponds to said first pair and said pair of power waveguides, such an injection locking waveguide, and such an opposing waveguide, form a reflection power combiner from which substantially all of such amplified energy exits at the injection locking waveguide of the reflection power combiner;
wherein another such first pair and second pair of power waveguides, means for introducing about one-half cycle phase difference between such amplified microwave energy entering such a combining region from such another first pair of power oscillator means and from such another second pair of power oscillator means, another such a body defining another such a combining region which corresponds to said another first pair and second pair of power waveguides, another such an injection locking waveguide, and another such an opposing waveguide, form a transmission microwave power combiner from which substantially all of such amplified microwave energy exits at the opposed waveguide of the transmission power combiner; and
wherein said reflection power combiner is one of four such reflection power combiners having such injection locking waveguides thereof individually connected to the power waveguides of such pairs thereof of the transmission power combiner,
so that injection locking microwave energy provided to the injection locking waveguide of the transmission power combiner controls such amplified microwave energy provided by such first and second pairs of power oscillators of the reflection power combiners, so that the reflection power combiners are such power oscillator means of the transmission power combiner, and so that such amplified microwave energy provided thereto from by the reflection power combiners is provided by the system at such opposing waveguide of the transmission power combiner.

13. The system of claim 6
wherein the system has a first pair of said power waveguides and a first pair of said power oscillator means corresponding thereto and has a second pair of said power waveguides and a second pair of said power oscillator means corresponding thereto, and
wherein the system further comprises phase difference means for introducing about a one-half cycle phase difference between such amplified microwave energy entering said combining region from said first pair of power oscillator means and such amplified microwave energy entering said region from said second pair of power oscillator means so that substantially all of such amplified microwave energy entering said region from said first power oscillator means from said second power oscillator means exits from said region at said opposed waveguide.

14. The system of claim 13 wherein said phase difference means comprises each power waveguide of said second pair thereof being longer than the power waveguides of said first pair thereof by a distance corresponding to about one-quarter cycle phase difference of said amplified microwave energy and of said injection locking mircowave energy.

15. The system of claim 13:
wherein said first pair and said second pair of power waveguides, said first pair and said second pair of power oscillator means, said phase difference means, such a body defining such a combining region corresponding to said pairs of waveguides, such an injection locking waveguide, and such an opposing waveguide, form a microwave power combiner, and
wherein said system comprises a plurality of said microwave power combiners connected in cascaded relation with such opposing waveguide of a first such combiner directly connected to the injection locking waveguide of a second such combiner so that such injection locking waveguide of said second combiner receives such amplified microwave energy from power oscillator means of said combiner.

16. The system of claim 15 wherein such power oscillator means of said second microwave power combiner provide substantially more microwave energy than such power oscillator means of said first microwave power combiner and are too powerful for injection locking by such injection locking energy provided to the injection locking waveguide of said first combiner, but are injection locked by such amplified microwave energy received from the power oscillators of said first combiner.

17. The system of claim 16 where such power oscillator means of said first combiner and of said second combiner derive such amplified microwave energy from a plurality of substantially identical primary oscillators, and each such power oscillator means of said second combiner has a larger number of said primary oscillators than each such power oscillator means of said first combiner.

18. An element for use in combining microwave energy from a plurality of sources, the element comprising a metallic cube defining centrally therein a spherical cavity and defining six port cavities of rectangular parallelepiped configuration extending individually and perpendicularly inwardly from each face of the cube so that the element has three pairs of the port cavities disposed with each pair thereof extending oppositely from the spherical cavity along a corresponding diameter thereof; each of said port cavities having one end smaller dimensionally than the spherical cavity and opening thereinto and having an opposite end opening through the corresponding face of the cube; each port cavity having a pair of wider opposite planar surfaces and a pair of narrower opposite planar surfaces; each of said planar surfaces extending parallel to a diagonal of a face of the cube and to the corresponding such diameter and being rotationally disposed in relation thereto so that said wider surfaces and narrower surfaces of one port cavity of each of said pairs thereof are orthogonal to the corresponding surfaces of the other port cavity of the pair.

19. The element of claim 18 wherein the element has three of such port cavities which are adjacent to one corner of the cube; wherein three of the faces of the cube correspond individually to said three port cavities and have individual diagonals intersecting at said one corner; and wherein each such wider planar surface of said three of such port cavities is parallel to the corresponding one of said three diagonals.

20. The element of claim 18 wherein the cube:
  defines a generally spherical opening which is coaxially related to one of said diameters and extends between a face of the cube and the spherical cavity;
  includes a generally spherical cylindrical plug conforming to said opening and rotationally received therein, said plug defining centrally therein the port cavity corresponding to said face; and
  includes means for securing said plug at a predetermined rotational position about said diameter;
whereby the plug is positionable to place such a wider surface of said port cavity parallel with a predetermined diagonal of said face.

* * * * *